United States Patent
Condie et al.

(10) Patent No.: US 7,432,133 B2
(45) Date of Patent: Oct. 7, 2008

(54) PLASTIC PACKAGED DEVICE WITH DIE INTERFACE LAYER

(75) Inventors: Brian W. Condie, Mesa, AZ (US); Mahesh K. Shah, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 164 days.

(21) Appl. No.: 11/257,822

(22) Filed: Oct. 24, 2005

(65) Prior Publication Data

US 2007/0090543 A1     Apr. 26, 2007

(51) Int. Cl.
*H01L 21/48* (2006.01)
(52) U.S. Cl. .............................. 438/127; 257/E21.502
(58) Field of Classification Search .......... 257/E21.499, 257/E21.502, E21.503
See application file for complete search history.

(56) References Cited

U.S. PATENT DOCUMENTS

| | | | |
|---|---|---|---|
| 5,450,283 A * | 9/1995 | Lin et al. ..................... | 361/704 |
| 5,458,709 A | 10/1995 | Kamezaki et al. | |
| 5,578,860 A | 11/1996 | Costa et al. | |
| 5,593,526 A | 1/1997 | Yokouchi et al. | |
| 5,598,034 A | 1/1997 | Wakefield | |
| 6,001,673 A | 12/1999 | Marcinkiewicz | |
| 6,107,164 A * | 8/2000 | Ohuchi ........................ | 438/465 |
| 6,407,459 B2 * | 6/2002 | Kwon et al. ................. | 257/780 |
| 6,713,590 B2 | 3/2004 | Lau et al. | |
| 6,744,117 B2 | 6/2004 | Dragon et al. | |
| 6,849,696 B2 | 2/2005 | Lau et al. | |
| 6,890,641 B1 | 5/2005 | Mukherjee et al. | |

OTHER PUBLICATIONS

Prassas, Michael, Silica Glass from Aerogels, Sol-Gel Gateway: Glass from Aerogels, http://www.solgel.com/articles/april01/aerog2.htm and http://solgel.com.articles/april01/aerog.htm.
Simmonds, M. et al., SiLK Semiconductor Dielectric Resin Films, technical paper, Dow Chemical Company, pp. 1-7.
Dow Unveils Advanced SiLK Resin Featuring Drastically Smaller Pore Size, Introduces First Porous ILD to Enable Continuous Tantalum Barriers, Dow Chemical Company, Dec. 25, 2003, http://www.dow.com/silk/news/20030918b.htm.

(Continued)

*Primary Examiner*—Scott B Geyer
(74) *Attorney, Agent, or Firm*—Ingrassia, Fisher & Lorenz, P.C.

(57) ABSTRACT

Structure and method are provided for plastic encapsulated semiconductor devices having a buffer layer of low dielectric constant and/or low loss tangent material separating the die surface from the plastic encapsulation. Semiconductor wafers with substantially completed SC die are coated with the buffer layer. The buffer layer is patterned to expose the die bonding pads but leave the buffer layer over some or all of the other die metallization. The die are then separated, mounted on a lead-frame or other support, wire bonded or otherwise coupled to external leads, and encapsulated. The plastic encapsulation surrounds the die and the buffer layer, providing a solid structure. The buffer layer reduces the parasitic capacitance, cross-talk and loss between metallization regions on the die. An optional sealing layer may also be provided at the wafer stage between the buffer layer and the plastic encapsulation to mitigate any buffer layer porosity.

8 Claims, 8 Drawing Sheets

OTHER PUBLICATIONS

Perry, J. et al., SiLK Semiconductor Dielectric Resins, technical paper, Dow Chemical Company, pp. 1-6.
SiLK Works, Dow Chemical Company, http://www.dow.com/silk/index.htm.
Physical Science—Sol Gel Introduction, http://www.bell-labs.com/org/physicalsciences/projects/solgel/solgel.html.
Sol-Gel Technologies, Sol-Gel Improves the quality of Human life, http://www.sol-gel.com/technology.html.
Phalippou, Jean, Sol-Gel: A Low Temperature Process for the Materials of the New Millenium, Sol-Gel Tutorial, http://www.solgel.com/articles/June00/phalip/introsolgel.htm.
Peters, Laura, Is Pore Sealing Key to Ultralow-k Adoption?, Semiconductor International, Oct. 1, 2005, http://www.reed-electronics.com/semiconductor/article/CA6260716?industryid=3032&nid=2012.

* cited by examiner

FIG. 10 ns in capacitive coupling (e.g., "cross-talk")
PLASTIC PACKAGED DEVICE WITH DIE INTERFACE LAYER The present invention generally relates to semiconductor devices, and more particularly to plastic encapsulated semiconductor devices with a die interface layer.

BACKGROUND

Figure 1:
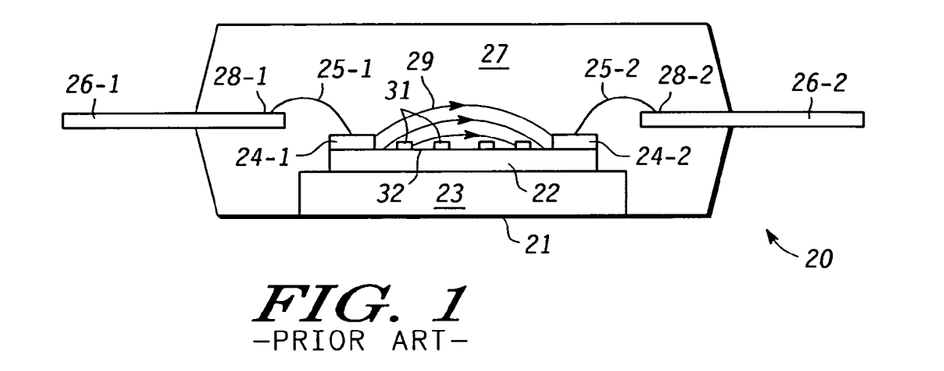
FIG. 1 shows a simplified schematic cross-sectional view through a prior art molded plastic packaged device containing a semiconductor (SC) die.

Semiconductor (SC) devices are often encapsulated in molded plastic. The molded plastic surrounds and protects the semiconductor die, supports the bonding wires and external leads and imparts ruggedness and shock resistance to the device. Plastic packaged devices are widely used. FIG. 1 shows a simplified schematic cross-sectional view through prior art molded plastic package 20 containing semiconductor (SC) die 22. SC die 22 is conveniently but not essentially mounted on heatsink 23. Metal contact regions 24-1, 24-2 (collectively 24) are provided on SC die 22 to which external leads 26-1, 26-2 (collectively 26) are coupled by wirebonds or other means 25-1, 25-2 (collectively 25). Conductors and interconnections (e.g., metal traces) 31 on die surface 32 are also shown. Plastic encapsulant 27 is molded around SC die 22, conductors 31, wirebond pads 24, wirebonds 25, inner portions 28-1, 28-2 (collectively 28) of external leads 26, so that, in this example, lower surface 21 of heatsink 23 remains exposed on the lower face of package 20, but having surface 21 exposed is not essential. While plastic encapsulation, such as is illustrated in FIG. 1 and equivalents, is widely used, it suffers from a number of disadvantages and limitations well known in the art. Among these are that plastic encapsulation 27 surrounding SC die 22 and leads 25 and 28 and covering conductors 31 has a significantly higher dielectric constant $\epsilon_e$ and loss tangent $\delta_e$ than does air or vacuum. For example, commonly used plastic encapsulants for semiconductor devices often have dielectric constants $\epsilon_e$ in the range 3.5 to 5.0 and loss tangents $\delta_e$ in the range 0.005 to 0.015 for the frequency ranges of interest. These are sufficient to cause significant degradation of performance, especially at high frequencies and high voltages. Fringing electric field 29 (created when voltage is applied) extends into plastic encapsulant 27 between various conductors 31 and 24 on surface 32 of SC die 22. This results in capacitive coupling (e.g., "cross-talk") and power loss (e.g., heat dissipation) in encapsulation 27. These increase as the dielectric constant $\epsilon_e$ and loss tangent $\delta_e$ of encapsulation 27 increase. Such cross-talk and loss are undesirable.

Figure 2:
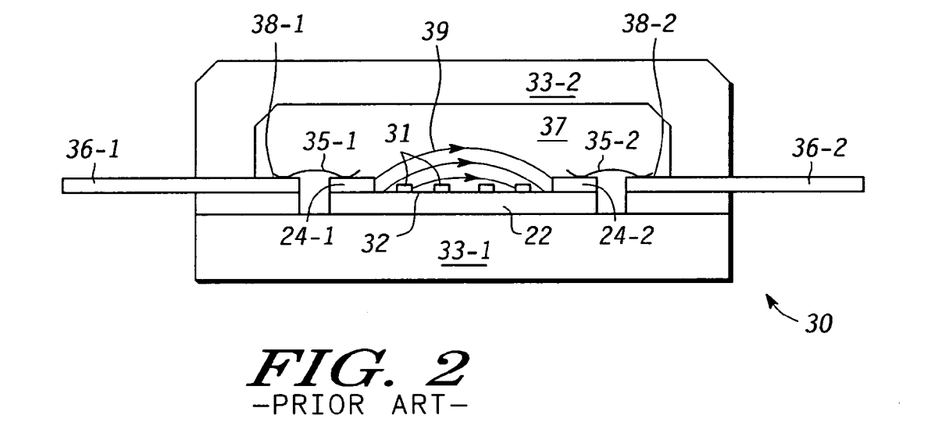
FIG. 2 shows a simplified schematic cross-sectional view through a prior art hollow package device containing a semiconductor (SC) die.

In the prior art, the capacitive coupling and loss associated with this fringing electric field extending outside of the SC die has been mitigated or avoided by, for example: (i) using a Faraday shield (not shown) over the die, and/or (ii) using hollow ceramic or metal packages that provide an air or vacuum space over the die sensitive surface with conductors 24, 31 and also usually around the wirebonds and inner package leads. A Faraday shield constrains the fringing fields but at the cost of additional die complexity due to the additional conductor and masking layers required. A vacuum or airspace package is illustrated in FIG. 2, which shows hollow package 30 having air or vacuum space 37 surrounding die 32. Die 32 is mounted on, for example, metal, ceramic or plastic base 33-1 to which are attached external leads 36-1, 36-2 (collectively 36). Wirebonds or other connections 35-1, 35-2 (collectively 35) couple bonding pads 34-1, 34-2 (collectively 34) on die 32 to inner portions 38-1, 38-2 (collectively 38) of package leads 36-1, 36-2 (collectively 36). Cap 33-2 is placed over substrate 34, die 32, wirebonds or other connections 35 and inner portions 38 of package leads 36. Having air or vacuum space 37 around die 22 means that fringing electric field 39 is not in contact with any encapsulant. Therefore, an increase in coupling capacitance and/or loss caused by a plastic encapsulant in contract with the die surface and the various conductors is avoided. The dielectric constant $\epsilon_o$ and loss tangent $\delta_o$ of air or vacuum are low and so cross-talk and dielectric loss are minimized. However, such hollow packages are significantly more expensive and often not as rugged as plastic encapsulation. Wirebonds or other connections 35 can become detached if the finished device is subjected to large acceleration forces.

Thus, there continues to be a need for improved semiconductor devices and methods that provide plastic encapsulated devices with reduced encapsulation related capacitive cross-talk and loss. Accordingly, it is desirable to provide improved semiconductor devices with plastic encapsulation having lower dielectric constant $\epsilon_{bl}$ and/or loss tangent $\delta_{bl}$ material in contact with the die surface. In addition, it is desirable that the improved plastic encapsulation materials, structures and methods allow a substantially solid structure to be formed surrounding the semiconductor die, die leads and bonding wires so as to provide a mechanically rugged package. It is further desirable that the improved devices be achieved using fabrication technology already available on or easily added to a typical semiconductor device manufacturing line so that only minor modification of the manufacturing process is required. It is still further desirable that these advantages be obtained at low cost. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The invention will hereinafter be described in conjunction with the following drawing figures, wherein like numerals denote like elements.

FIG. 8 shows a simplified flow chart illustrating a method for forming a plastic encapsulated semiconductor (SC)

device with a low capacitance and loss die interface buffer layer, according to the embodiment of FIG. 5;

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. As used herein, the term "lead-frame" is intended to include any supporting structure on which one or more individual or interconnected semiconductor die may be mounted, and may be metal, plastic ceramic, glass or combinations thereof. As used herein, the terms "semiconductor die" and abbreviation "SC die" are intended to include semiconductor devices of any sort and configuration, whether individual devices or complex assemblies of devices such as in integrated circuits, or any other configuration of semiconductor devices. As used herein the terms "wire bonds" and "bonding wires" are intended to include any means of electrically coupling package leads to contact regions and/or bonding pads on the SC die and not be limited merely to use of wires or the like. Non-limiting examples of other electrical coupling means are beam leads, solder bumps, metalized plastic tapes, and so forth. As used herein, the term "metal interconnects" and the like and the term "metal conductors" on the semiconductor die are intended to be interpreted broadly and include conductors of any material and not be limited merely to metallic materials. Non-limiting examples of such varied conductor materials are doped semiconductors, semi-metals, multilayered structures and so forth.

Figure 3:
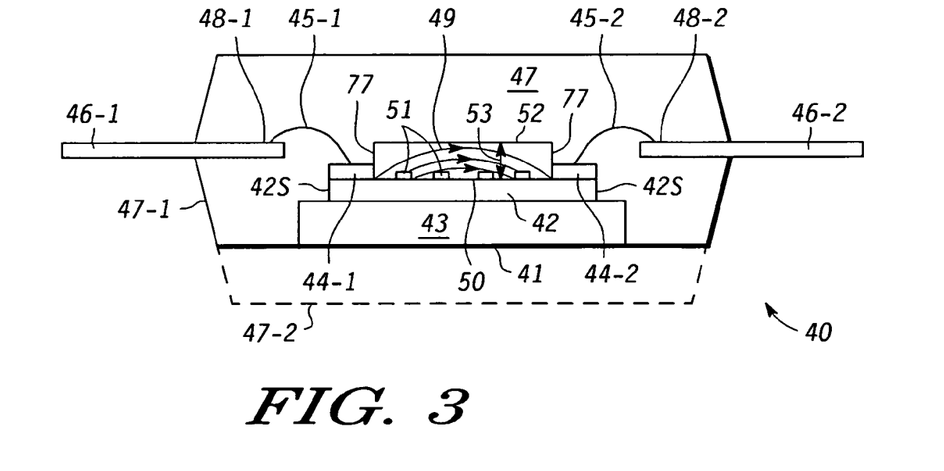
FIG. 3 shows a simplified schematic cross-sectional view through a molded plastic packaged device containing a semiconductor (SC) die, according to an embodiment of the present invention.

FIG. 3 shows a simplified schematic cross-sectional view through molded plastic packaged device 40 containing semiconductor (SC) die 42, according to an embodiment of the present invention. Device 40 comprises SC die or device 42 conveniently but not essentially mounted on heat sink 43 and surrounded (except perhaps for lower surface 41 of heat sink 43) by plastic encapsulation 47. As shown by outline 47-1, encapsulation 47 can surround heat sink 43 except for the lower surface 41. Alternatively, as shown by outline 47-2, plastic encapsulation 47 can surround heat sink 43 completely. Either arrangement is useful and not important to the present invention. Metal conductors and interconnects 51 are illustrated on SC die 42. Upper surface 50 of die 42 and conductors 51 are separated from encapsulation 47 by buffer layer 52 of thickness 53 having lower dielectric constant $\epsilon_{bl}$ and/or lower loss tangent $\delta_{bl}$ than dielectric constant $\epsilon_e$ and loss tangent $\delta_e$ of encapsulation material 47. Die 42 has connections (e.g., bonding pads) 44-1, 44-2 (collectively 44) on upper surface 50 of die 42. Lateral sides 42S of die 42 terminates upper die surface 50. Wirebonds or other connections 45-1, 45-2 (collectively 45) couple bonding pads 44 to inner portions 48-1, 48-2 (collectively 48) of external leads 46-1, 46-2 (collectively 46), in order to provide external electrical coupling to die 42. In general, bonding pads 44 lie substantially laterally outside of buffer layer 52, that is, buffer layer 52 does not significantly cover those portions of bonding pads 44 to which bonding wires or leads 45 are attached. Elements 41, 42, 43, 44, 45, 46 and 48 of device 40 are analogous in function to elements 21, 22, 23, 24, 25, 26 and 28 of device 20. Fringing electric field 49 associated with conductors 51 on die surface 50 passes substantially through lower $\epsilon_{bl}$ and/or $\delta_{bl}$ buffer layer 52. Devices 40 and 20 differ in that encapsulation 47 of device 40 is substantially not in contact with conductors 51 on surface 50 of SC die 42. Surface 50 and conductors 51 are protected and separated from encapsulation 47 by lower $\epsilon_{bl}$ and/or $\delta_{bl}$ buffer layer 52.

Low $\epsilon_{bl}$ and/or $\delta_{bl}$ buffer layer 52 needs to be chemically stable and electrically and chemically compatible with surface 50 and conductors 51 of SC die 42 so as to not upset the operation of SC die 42. Examples of suitable classes of materials are Sol-Gels, Aero-Gels, spin-on glasses and various organic materials such as PTFE, Teflon® and polyimides. Another useful material is low loss, low density CVD oxide material referred to in the art as "black diamond". SiLK™ manufactured by Dow Chemical Corporation of Midland, Mich. is another example of a suitable material. Such materials are well known in the art. To be effective the dielectric constant $\epsilon_{bl}$ and/or the loss tangent $\delta_{bl}$ of such materials needs to be lower than the dielectric constant $\epsilon_e$ and/or the loss tangent $\delta_e$ of encapsulant 47. In general, the dielectric constant $\epsilon_{bl}$ of layer 52 should be usefully less than about 3.5, conveniently less than or equal about 3.0 and preferably less than or equal about 2.8, and the loss tangent $\delta_{bl}$ less than about 0.005. Depending upon the choice of material for buffer layer 52, either the dielectric constant $\epsilon_{bl}$ or the loss tangent $\delta_{bl}$ or both may be reduced compared to $\epsilon_e$ and/or $\delta_e$ of encapsulation 47. Reducing the dielectric constant $\epsilon_{bl}$ reduces the crosstalk. Reducing the loss tangent $\delta_{bl}$ reduces the power loss.

Either result is beneficial. It is desirable that both $\epsilon_{bl}$ and $\delta_e$ be reduced but this is not essential and the expressions "low $\epsilon_{bl}$ and/or $\delta_{bl}$" and "lower $\epsilon_{bl}$ and/or $\delta_{bl}$" are intended to include having either $\epsilon_{bl}$ or $\delta_{bl}$, or both $\epsilon_{bl}$ and $\delta_{bl}$, reduced compared to $\epsilon_e$ and $\delta_e$ of encapsulation 47.

Figure 4:
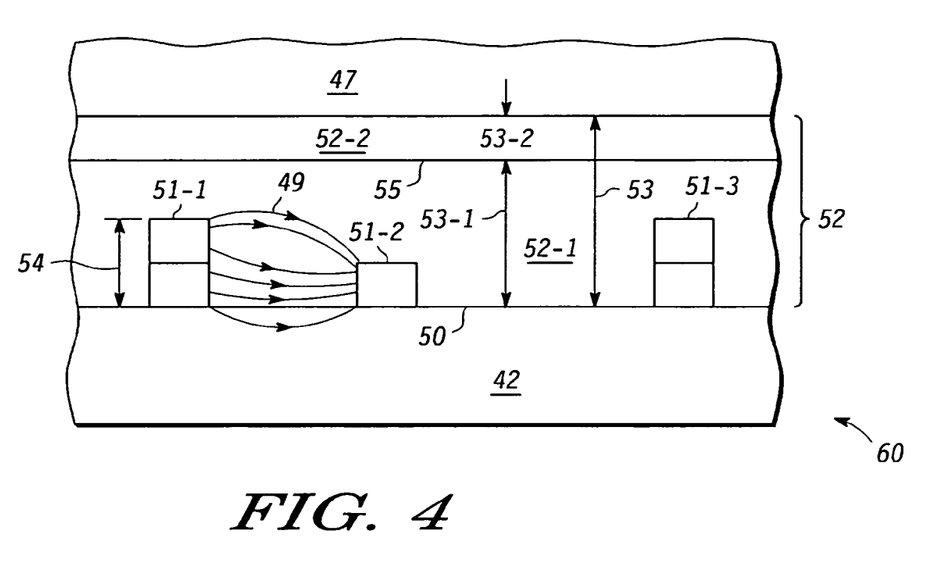
FIG. 4 shows a simplified schematic cross-sectional view through a portion of a SC die of FIG. 3, showing further details.

FIG. 4 shows a simplified schematic cross-sectional view through enlarged portion 60 of SC die 42 of FIG. 3, showing further details. Metal regions or conductors 51-1 and 51-3 (e.g. source and/or drain connections of an MOS device) on surface 50 of SC die 42 are, in this example, multi-layer structures of thickness 54 that are taller than metal region 51-2 (e.g., a gate connection). Fringing electric field 49 can extend between source or drain connection 51-1 and gate connection 51-2. This is a common situation in MOS devices, particularly for high frequency application at approximately 400 MHz and above. Buffer layer 52 with low dielectric constant $\epsilon_{bl}$ and/or low loss tangent $\delta_{bl}$ is of sufficient thickness 53 so that fringing field 49 lies substantially within buffer layer 52 rather than encountering overlying plastic encapsulation 47. This reduces the electrode to electrode capacitance and/or signal loss due to heat generation compared to what would occur if fringing field 49 passed through part of encapsulation 47. The lower capacitance reduces the cross-talk between such electrodes compared to prior art device 20 of FIG. 1. It will be noted that buffer layer 52 is not an interlayer dielectric separating different conductor layers, but lies outside such conductor layers so as to separate them from encapsulation 47.

Buffer layer 52 of FIG. 4 may be a homogeneous layer of thickness 53 or may be a structured layer having lower portion 52-1 of thickness 53-1 of low $\epsilon_{bl}$ and/or $\delta_{bl}$ such as has been described above, covered by sealing layer 52-2 of thickness 53-2. Some low dielectric constant materials are more porous, which might allow moisture to enter. Moisture porosity of buffer layer 52-1 is not desirable. Thus, it may be desirable to provide optional sealing layer 52-2 covering outer surfaces 55 (e.g., the top and side surfaces) of buffer layer 52-1 so that the risk of moisture penetration to surface 50 is reduced or avoided. Examples of suitable materials for optional sealing layer 52-2 are CVD deposited $SiO_2$, polyimide, parylene etc. Another approach to create sealing layer 52-2 is in-situ development of sealing layer 52-2 by exposing layer 52-1 to a plasma or other catalyst to promote, for example, cross-linking or other chemical" change to render portion 52-2 of layer 52 substantially impervious to moisture or other undesirable contaminants. Whether or not sealing layer 52-2 is needed depends upon the choice of substances for buffer layer 52-1 and encapsulant 47, the moisture sensitivity of die 42 and the environmental specifications that encapsulated device 40 is expected meet. These will vary from situation to situation and are within the competence of persons of skill in the art. Persons of skill in the art will understand how to decide whether sealing layer 52-2 is needed. While the use of sealing layer 52-2 is specifically illustrated in device portion 60 of FIG. 4, such a sealing layer can be also considered as a part of buffer layer 52 of device 40 of FIG. 3.

Figure 5:
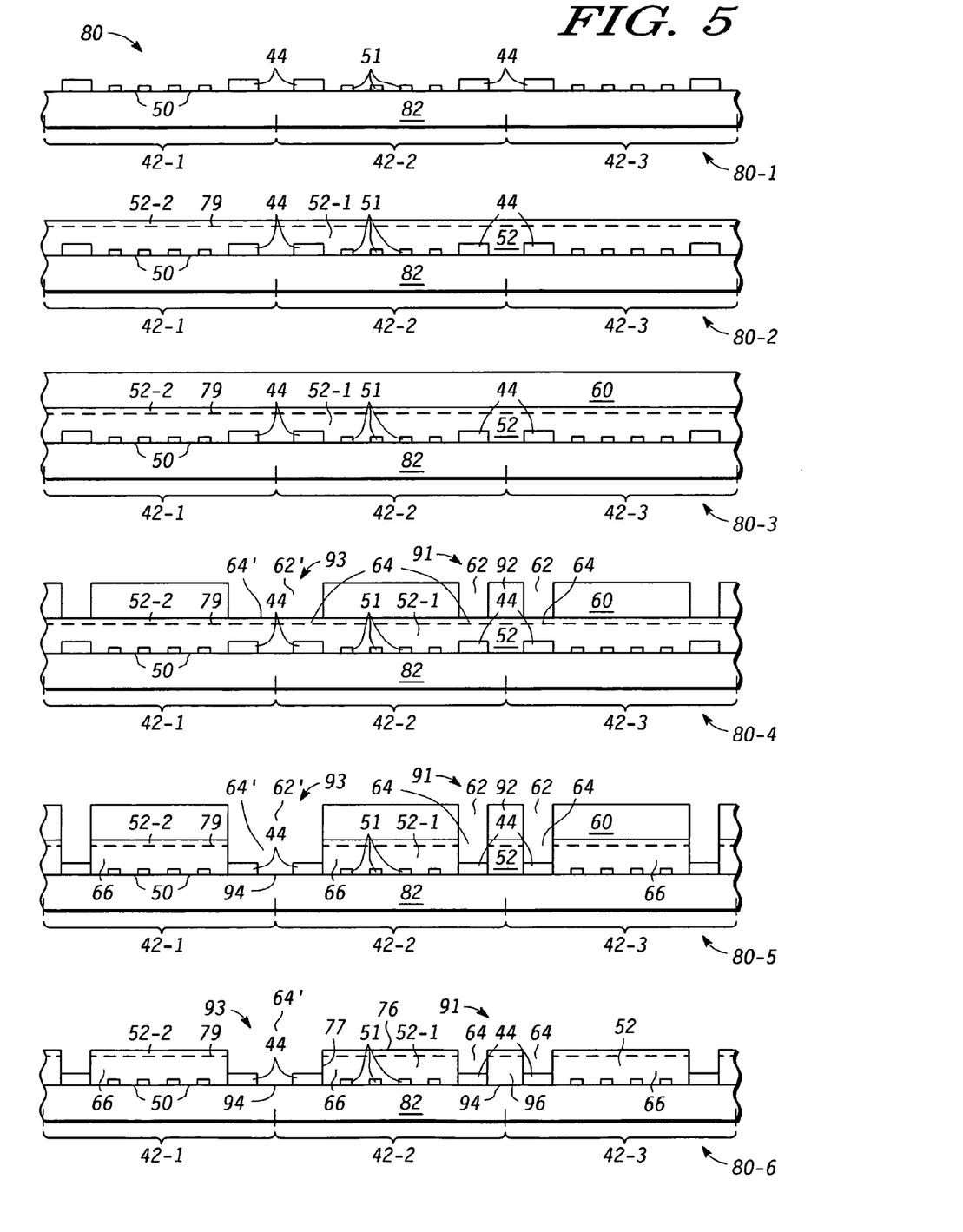
FIG. 5 shows a series of simplified schematic cross-sectional views at different stages of manufacture through a portion of a semiconductor wafer on which SC die of the type illustrated in FIGS. 3-4 are being fabricated.

FIG. 5 shows multiple simplified schematic cross-sectional views of wafer substrate 82 at different stages manufacture 80-1, 80-2, 80-3, 80-4, 80-5, 80-6 (collectively 80) on which multiple SC dice 42-1, 42-2, 42-3, . . . 42-N (collectively 42) of the type illustrated in FIGS. 3-4 are being simultaneously fabricated. Bonding pads 44 and metal interconnections or conductors 51 lie on upper surface 50 of die 42 of wafer 82. Stage 80-1 illustrates the situation where wafer 82 has been processed to the point where the semiconductor devices (e.g., die 42) are fully formed with the various doped regions, interconnecting conductors 51 and bonding pads 44 provided in or on surface 50, but wafer 82 has not yet been separated into individual die 42-1, 42-2, 42-3 . . . 42-N. Such processing is conventional. In stage 80-2 low $\epsilon_{bl}$ and/or $\delta_{bl}$ buffer layer 52 of thickness 53 is applied to surface 50 and over conductors 51 and bonding pads 44. Substantially entire surface 50 of wafer 82 is desirably coated with buffer layer 52 at the same time. This may be conveniently accomplished, for example, by a spin-on process in which the material of buffer layer 52 is dispensed onto surface 50 and then wafer 82 is spun at comparatively high speed to cause the dispensed material to flow out into a thin layer of substantially uniform thickness. However, other means of providing buffer layer 52 may also be used. Non-limiting examples are vacuum deposition, sputtering, chemical vapor deposition, silk screening, and so forth. Such procedures are well known in the art. The same techniques may be used to also apply optional sealing layer 52-2 illustrated in FIG. 4 and FIG. 7. Buffer layer 52 of FIG. 5 may include sealing layer 52-2, as indicated by dashed line 79. Being able to provide buffer layer 52 and (optionally) sealing layer 52-2 of uniform thicknesses over all of multiple dice 42 on wafer 82 at the same time is a significant advantage of the invented process.

In stage 80-3, masking layer 60 is deposited or formed over buffer layer 52 by any convenient means. Photoresist is an example of a suitable masking layer material. Photoresists and methods for applying them are well known in the art. In stage 80-4, openings 62, 62' are formed in masking layer 60, thereby exposing portions 64, 64' of buffer layer 52 lying above bonding pads 44. Two different masking examples are illustrated in FIG. 5. In region 91 on the right half of stages 80-4 . . . 80-6, opening 62 is intended to uncover bonding pads 44 and in region 93 on the left half of stages 80-4 . . . 80-6, opening 62' is intended to uncover bonding pads 44 and saw street 94 lying between die 42-1 and 42-2. In region 91, portion 96 of buffer layer 52 remains over saw street 94, while in region 93 it has been removed. Either arrangement is useful depending upon the particular wafer configuration chosen by the designer. As used herein, the term "saw street" is intended to include any space provided on the wafer for use in separating the wafer into individual die and is not limited to sawing or any other particular means and method for performing this well known function. In stage 80-5, portions 64, 64' of buffer layer 52 are removed, for example, by etching or other convenient means well known in the art, thereby substantially exposing bonding pads 44 in region 91 and bonding pads 44 plus saw street 94 between die 42-1 and 42-2, and leaving undisturbed portions 66 of buffer layer 52 over surfaces 50 of dice 42-1, 42-2, 42-3 . . . 42-N between bonding pads 44. In optional stage 80-6, masking layer 60 may be removed. This is convenient but not essential. Buffer layer 52 may be cured after stage 80-2 or after stage 80-6, whichever is more convenient. Curing after stage 80-6 is preferred but not essential. After stage 80-6, wafer 82 may then be cut along saw streets 94 using means well known in the art into separate individual die 42-1, 42-2, 42-3 . . . 42-N, which can then be mounted on an appropriate lead-frame and encapsulation 47 provided (see FIGS. 3-4), e.g., using standard techniques such as injection or transfer molding. The advantage of above-described process 80 is that buffer layer 52 is formed on die 42 at the wafer level, that is, applied to substantially all device dice of a wafer at the same time. This is desirable and economic. If sealing layer 52-1 (indicated by dashed line 79) is formed with or as a part of buffer layer 52-2 prior to stage 80-3, then as can be seen in stage 80-6, upper surface 76 of buffer layer 52 is sealed, but sidewalls 77 of buffer layer 52 adjacent bonding pads 44 are not covered by sealing layer 52-2. However, buffer layer 52 is generally very thin compared to its lateral dimensions, so that the area for moisture ingress via sidewalls 77 (ingress area=bonding pad perimeter times the thickness of layer 52) may be so small as to be negligible. But, even this small risk may be avoided as explained in connection with FIGS. 6-7.

Figure 6:
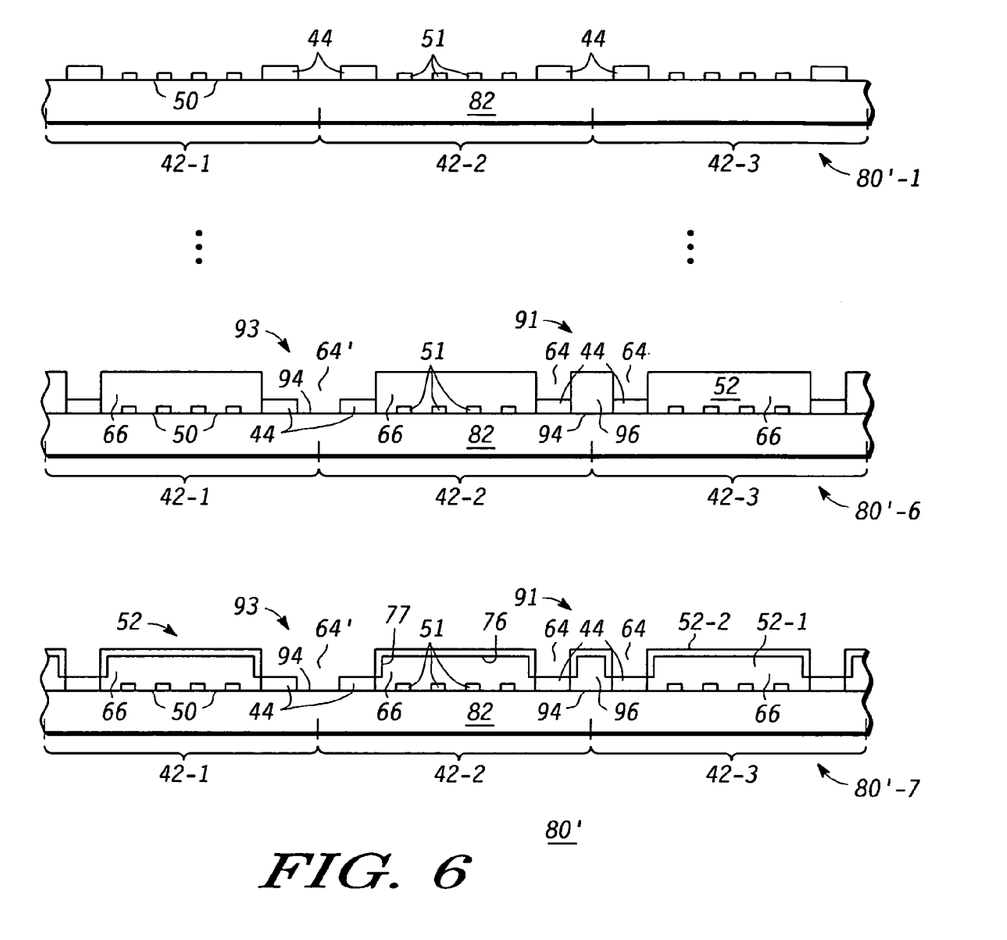
FIG. 6 shows a series of simplified schematic cross-sectional views at different stages of manufacture through a portion of a semiconductor wafer on which SC die of the type illustrated in FIGS. 3-4 are being fabricated, according to a further embodiment.

FIG. 6 shows multiple simplified schematic cross-sectional views of wafer substrate 82 at different stages of manufacture 80'-1, 80'-2, 80'-3, 80'-4, 80'-5, 80'-6, 80'-7 (collectively 80') on which multiple SC dice 42-1, 42-2, 42-3, . . . 42-N (collectively 42) of the type illustrated in FIGS. 3-4 are being simultaneously fabricated, according to a further embodiment. Stages 80'-1 through 80'-6 are substantially the same as analogous stages 80-1 thru 80-6 of FIG. 5 but without a sealing layer, and the description thereof in connection with FIG. 5 is incorporated herein by reference. Region 91 illustrates the situation where portion 96 of buffer layer 52 is left in place on saw street 94 and region 93 illustrates the situation where portion 96 is removed and saw street 94 between die 80-1 and die 80-2 exposed through opening 64'. In stage 80'-7 of FIG. 6, sealing layer or region 52-2 is formed on upper surface 76 and side surfaces 77 of buffer layer portion 52 by, for example, exposing wafer 82 after stage 80'-6 to a plasma or other catalyst or reactant to promote cross-linking or hardening of the outer surface regions of buffer layer 52 to reduce its porosity and/or permeability to moisture or other contaminants. The unconverted portion of buffer layer 52 is identified by reference number 52-1 and the converted portion of layer 52 (i.e., the sealing layer) is identified by reference number 52-2. In this manner both upper surface 76 and sidewalls 77 of buffer layer 52 are sealed against, for example, moisture incursion. Further masking steps are not required.

Figure 7:
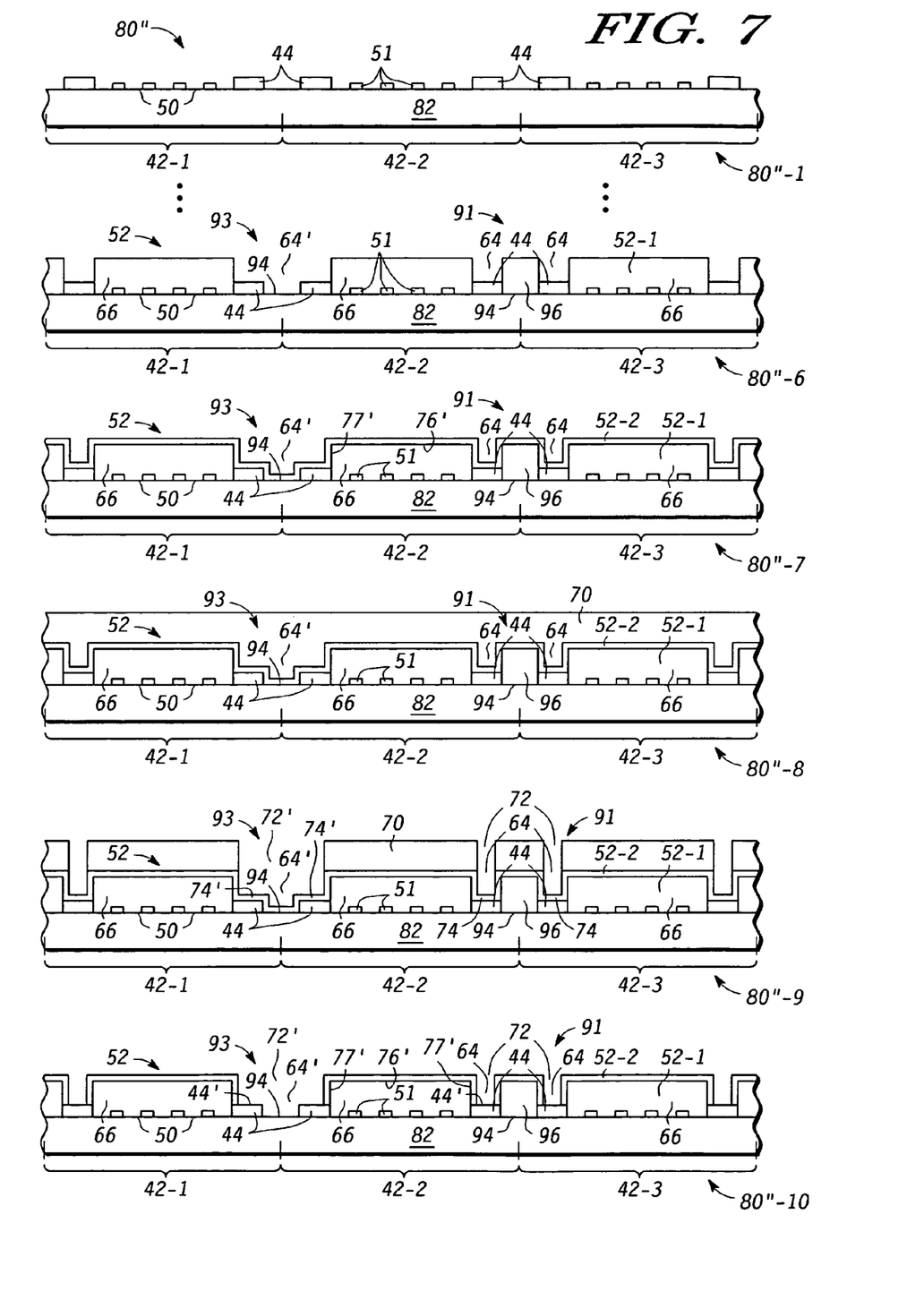
FIG. 7 shows a series of simplified schematic cross-sectional views at different stages of manufacture through a portion of a semiconductor wafer on which SC die of the type illustrated in FIGS. 3-4 are being fabricated, according to a still further embodiment.

FIG. 7 shows multiple simplified schematic cross-sectional views of wafer substrate 82 at different stages of manufacture 80"-1 through 80"-10 (collectively 80") on which multiple SC dice 42-1, 42-2, 42-3, . . . 42-N (collectively 42) of the type illustrated in FIGS. 3-4 are being simultaneously fabricated, according to a still further embodiment. Stages 80"-1 through 80"-6 are substantially the same as analogous stages 80-1 thru 80-6 of FIG. 5 without a sealing layer and the description thereof in connection with FIG. 5 is incorporated herein by reference. In region 91, bonding pads 44 are exposed and in region 93, bonding pads 44 and saw street 94 are exposed, as has been previously described. In stage 80"-7 of FIG. 7, sealing layer 52-2 is deposited substantially conformally over buffer layer 52-1, that is, on both upper surfaces 76' and side surfaces 77' of buffer layer 52-1. Any number of familiar processes may be used to form sealing layer 52-2 as for example and not intended to be limiting, chemical vapor deposition (CVD), evaporation, sputtering, spin-on coating, screening, and so forth, using one or more of the various sealing materials previously described. In stage 80"-8, masking layer 70 of, for example, photoresist or other etch mask material is formed over sealing layer 52-2. In stage 80"-9 openings 72, 72' are formed in masking layer 70 over. In region 91, openings 72 extend over central portions 44' of bonding pads 44, so that in stage 80"-10, mask openings 72 may be used to remove portions 74 of sealing layer 52-2 over central portions 44' of bonding pads 44, leaving sealing layer 52-2 in place over sidewalls 77' as well as upper surfaces 76' of buffer layer 52-1. In region 93, openings 72' extend over central portions 44' of bonding pads 44 and saw street 94 so that, in stage 80"-10, mask openings 72' may be used to remove portions 74' of sealing layer 52-2 over both central portions 44' and saw street 94, leaving sealing layer 52-2 in place over sidewalls 77' as well as upper surface 76' of buffer layer 52-1. Wirebonds or other connections may then be made to central portions 44' of bonding pads 44 while buffer layer 52-1 is protected on otherwise exposed surfaces 76' and 77' by substantially conformal sealing layer 52-2. As used herein, the term "central portion", singular or plural is intended to include any regions of bonding pads 44 exposed through sealing layer 52-2 where wirebonds or other external electrical connections may be made and not be limited merely to a center region of the pad, although that is not precluded. Either masking arrangement illustrated in regions 91, 93 may be used, depending upon the wafer configuration chosen by the designer, the difference being that in region 91 the buffer layer is left in place on saw street 94 and in region 93 it is removed as a part of the process of providing buffer layer 52-1 and sealing layer 52-2.

In FIGS. 5-7, sequential processing steps 80-1 . . . 80-6; 80'-1 . . . 80'-7 and 80"-1 . . . 80"-10 illustrate the situation where the masking and removal steps expose bonding pads 44 through buffer layer 52 (and sealing layer 52-2), but this is not intended to be limiting and other areas of the die surface not supporting conductors 51 may also be exposed by such masking and removal steps. For example, the portions of wafer 82, e.g., saw street 94 where the scribe grid or other die separation areas are located may also be exposed during such masking and removal steps, as is illustrated in region 93. This provides multiple dice having buffer layer 52 (with or without sealing layer 52-2) over surface conductors 51 but not substantially on bonding pads 44 or lateral die sides 42S. Such outcome is illustrated for example in FIG. 3.

Figure 8:
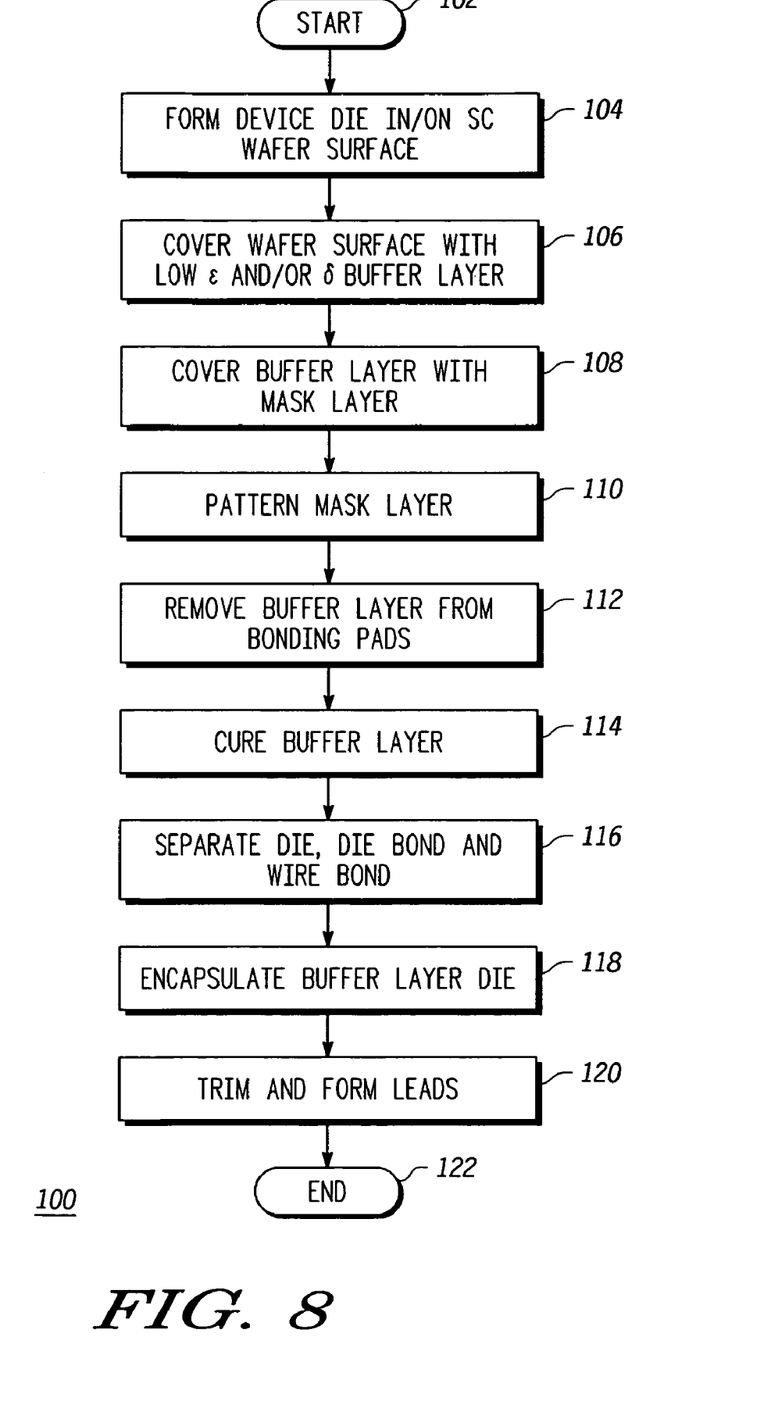

FIG. 8 shows a simplified flow chart illustrating method 100 for forming plastic encapsulated semiconductor (SC) device 40 with low $\epsilon_{bl}$ and/or $\delta_{bl}$ buffer layer 52 on die 42. Referring now to FIGS. 5 and 8, method 100 begins with START 102 and initial step 104 wherein die 42 are formed in and/or on (abbreviated "IN/ON" in FIGS. 8-10) wafer 82 (see stage 80-1 of FIG. 5). In step 106 corresponding to stage 80-2, wafer 82 (and die 42) is covered with low $\epsilon_{bl}$ and/or $\delta_{bl}$ layer 52. Advantage is gained as long as either or both of $\epsilon_{bl}$ or $\delta_{bl}$ of buffer layer 52 are less than corresponding $\epsilon_e$ or $\delta_e$ of encapsulation 47, respectively. In subsequent step 108, buffer layer 52, is covered with masking layer 60 (stage 80-3). In step 110, making layer 60 is patterned to provide the desired openings in buffer layer 52 above bonding pads 44 (stage 80-4). In step 112, buffer layer 52 is removed from above bonding pads 44, leaving buffer layer 52 covering surface 50 and conductors and interconnections 51 on the remainder of dice 42 (stage 80-5). In step 114, buffer layer 52 is conveniently but not essentially cured. As previously noted in connection with the discussion of FIG. 5, cure step 114 may be conveniently performed anytime after step 106, so the sequential position of step 114 in method 100 is merely for convenience of explanation and not intended to be limiting. Removal of masking later 60 as indicated in stage 80-6 of FIG. 5 is not shown in FIG. 8 and may be omitted or performed anytime after step 112. In step 116, finished wafer 82 is cut into separate individual die 42 and these multiple dice are, for example, bonded onto a lead-frame or other support and wire bonds or other electrical connections are made to bonding pads 44. The lead-frame and dice are now ready for encapsulation, which is carried out in step 118, wherein the mounted, wire bonded buffer layer coated dice are enclosed in encapsulant 47 (see FIGS. 3-4). Depending upon the particular type of package design, then optional step 120 may be performed to trim the lead-frame and form the package leads into their intended shape. Such trim and form operations are conventional. Method 100 then proceeds to END 122.

Figure 9:
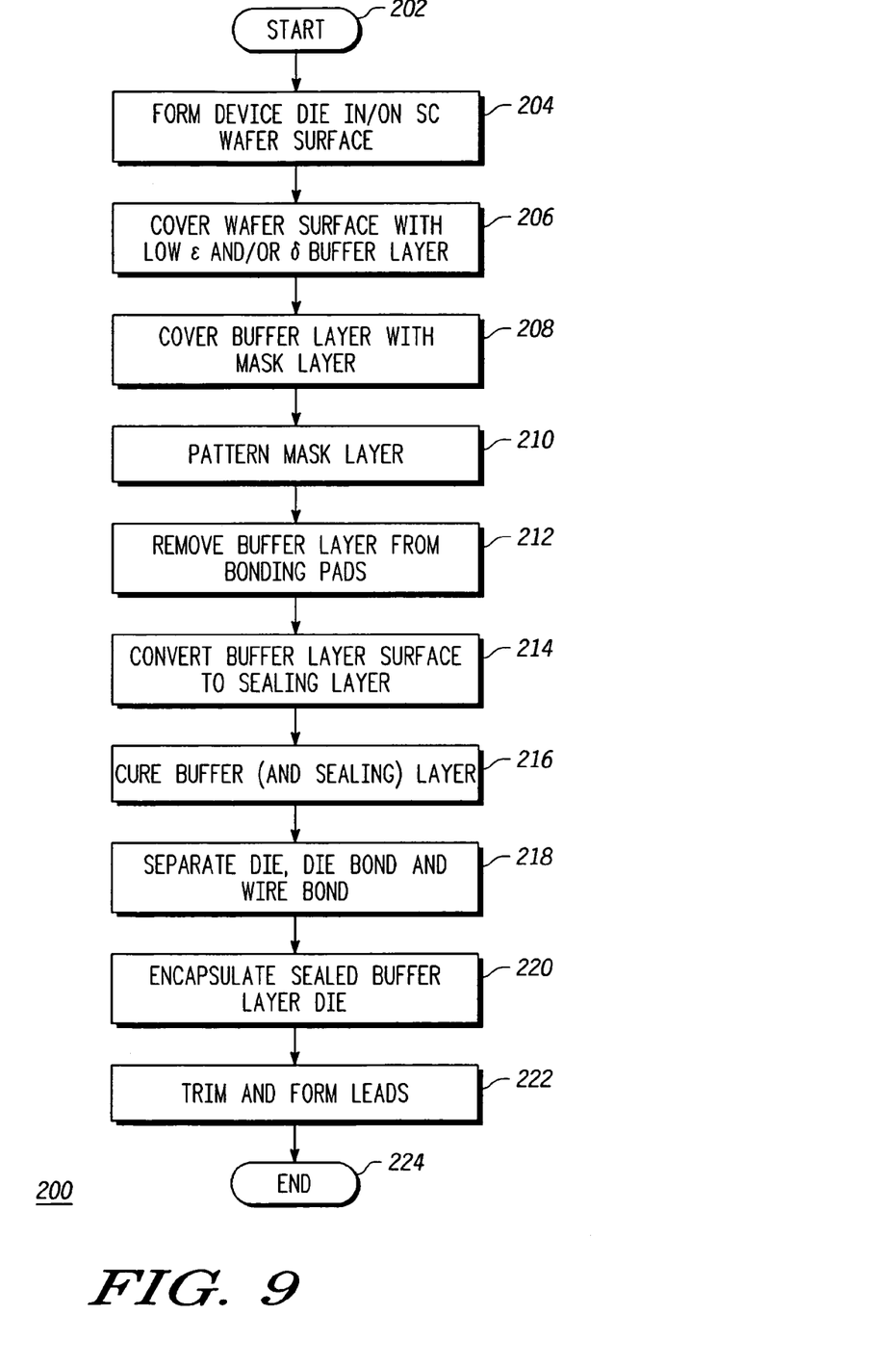
FIG. 9 shows a simplified flow chart illustrating a method for forming a plastic encapsulated semiconductor (SC) device with a low capacitance and loss die interface buffer layer, according to the embodiment of FIG. 6.

FIG. 9 shows a simplified flow chart illustrating method 200 for forming plastic encapsulated semiconductor (SC) device 40 with low $\epsilon_{bl}$ and/or $\epsilon_{bl}$ buffer layer 52 on die 42, according to a further embodiment. Referring now to FIGS. 6 and 9, method 200 begins with START 202 and initial step 204 (stage 80'-1) and proceeds through step 212 (stage 80'-6). Steps 204-212 of method 200 are analogous to steps 104-112 of method 100 of FIG. 8. Accordingly, the discussion of steps 104-112 is incorporated herein by reference. In step 214 (stage 80'-7), outer surfaces 76', 77' of buffer layer 52 are treated as described in connection with FIG. 6 to convert it to a sealing layer. Cure step 216 of method 200 is analogous to cure step 114 of method 100 and is not limited to the specific position indicated in the sequence of steps of method 200. Buffer layer 52-1 and sealing layer 52-2 may be cured at the same time or separately depending upon the choice of materials and treatments used. Depending upon the treatment chosen, sealing later 52-2 may not require any separate curing step. Persons of skill in the art will understand how to select the optimum sequence for curing buffer layer 52-1 (and optionally sealing layer 52-2) depending upon the material and treatment choices they have made for forming buffer layer 52. Steps 218-220 of method 200 are analogous to steps 116-120 of method 100 and the discussion thereof in connection with FIG. 6 is incorporated herein by reference. Method 200 then proceeds to END 224.

Figure 10:
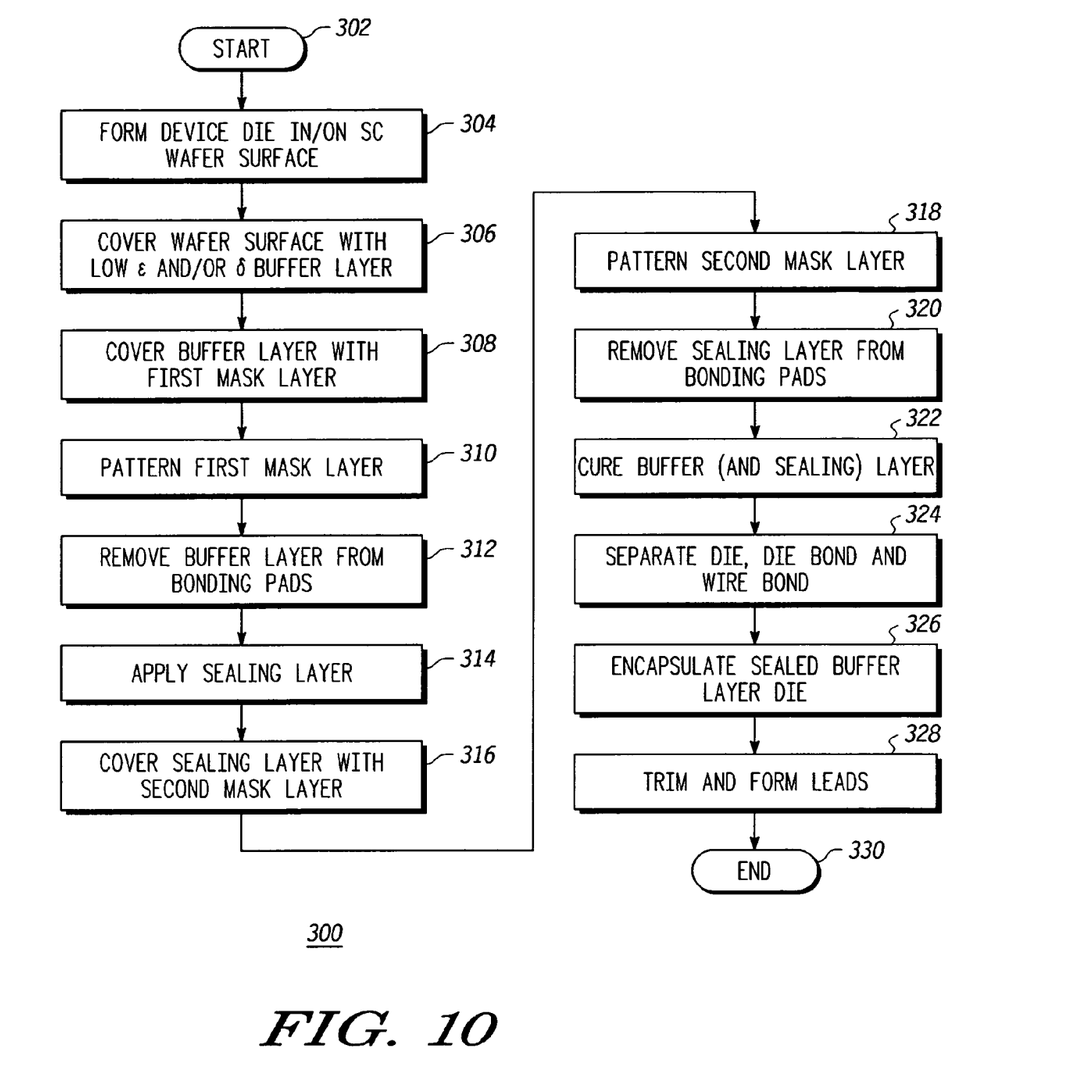
FIG. 10 shows a simplified flow chart illustrating a method for forming a plastic encapsulated semiconductor (SC) device with a low capacitance and loss die interface buffer layer, according to the embodiment of FIG. 7.

FIG. 10 shows a simplified flow chart illustrating method 300 for forming plastic encapsulated semiconductor (SC) device 40 with low $\epsilon_{bl}$ and/or $\epsilon_{bl}$ buffer layer 52 on die 42, according to a still further embodiment. Referring now to FIGS. 7 and 10, method 300 begins with START 302 and initial step 304 (stage 80"-1) and proceeds through step 312 (stage 80"-6). Steps 304-312 of method 300 are analogous to steps 104-112 of method 100 of FIG. 8. Accordingly, the discussion of steps 104-112 is incorporated herein by reference. In step 314 (stage 80"-7) sealing layer 52-2 is applied substantially conformally over the entire wafer, but at least over surface 50, bonding pads 44 and conductors 51. In step 316 (stage 80"-8), sealing layer 52-2 is covered with second masking layer 70 of, for example, photoresist. In step 318 (stage 80"-9), masking layer 70 is patterned to expose portions 74 of sealing layer 52-2 above central regions 44' of bonding pads 44. In step 320 (stage 80"-10), portion s74 of sealing layer 52-2 are removed from central regions 44' of bonding pads 44, by any convenient means (etching, developing and dissolving, etc.) depending upon the material chosen for sealing layer 52-2. In stage 80"-10, the masking portions of masking layer 70 are shown as having been removed, but this is not essential. In step 322, buffer layer 52-1 and sealing layer 52-2 are cured. As noted in connections with methods 100, 200, cure step 322 may be performed at various stages of the process for buffer layer 52-1 anytime after it is applied, and for sealing layer 52-2 anytime after it has been applied. Buffer layer 52-1 and sealing layer 52-2 may be cured separately or together, and the position of cure step 322 in method 300 of FIG. 10 between steps 320 and 324 is merely for convenience of explanation and not intended to be limiting. Persons of skill in the art will understand how to select an appropriate time or sequence during method 300 for such cure steps, depending for example, upon the particular combination of materials they have chosen. Steps 324-328 are analogous to steps 116-120 of method 100 of FIG. 8, the discussion of which is incorporated herein by reference. Method 300 then proceeds to END 330.

According to a first embodiment, there is provided a semiconductor device, comprising, a supporting member, a semiconductor die having an outward facing die surface with one or more electrical conductors thereon, wherein the outward facing die surface is laterally terminated by a side surface and the die is mounted on a portion of the supporting member, a plastic encapsulation having dielectric constant $\epsilon_{bl}$ and loss tangent $\delta_{bl}$ enclosing at least part of the supporting member and the die, and a buffer layer of lower dielectric constant $\epsilon_{bl}$ and/or loss tangent $\delta_{bl}$ than $\epsilon_e$ and $\delta_e$, respectively, of the plastic encapsulation, located between the plastic encapsulation and the outward facing die surface and covering some or all of the one or more electrical conductors thereon but substantially not the side surface. In a further embodiment, the buffer layer has a dielectric constant $\epsilon_{bl}$ less than about 3.0. In a still further embodiment, the buffer layer has a loss tangent $\delta_{bl}$ less than about 0.005. In a yet further embodiment, the device further comprises a sealing layer located between the buffer layer and the plastic encapsulation. In a still yet further embodiment, the device further comprises bonding pads on the outward facing die surface and wherein the buffer layer extends over the outward facing die surface substantially between the bonding pads on the outward facing die surface, without substantially covering the bonding pads. In a yet still further embodiment, the buffer layer has a first surface substantially conforming to the outward facing die surface between the bonding pads and one or more second laterally facing surfaces adjacent the bonding pads. In an additional embodiment, the device further comprises a sealing layer located between the buffer layer and the plastic encapsulation on the first and second surfaces of the buffer layer.

According to a second embodiment, there is provided a semiconductor device with external leads, comprising, a semiconductor die having a principal surface with interconnection conductors thereon and bonding pads thereon adapted to be coupled to the external leads, a plastic encapsulation having a first dielectric constant and a first loss tangent surrounding one or more faces of the semiconductor die, a buffer layer having a second dielectric constant and second loss tangent and located between the plastic encapsulation and the principal surface of the semiconductor die, covering at least some of the interconnections, but not substantially covering bonding pad regions used to electrically couple the bonding pads to the external leads, and wherein at least one of the second dielectric constant or second loss tangent is smaller then the corresponding first dielectric constant or first loss tangent. According to a further embodiment, the second dielectric constant and the second loss tangent are both smaller than the corresponding first dielectric constant and first loss tangent. According to a still further embodiment, the device further comprises a sealing layer located between the buffer layer and the plastic encapsulation. According to a yet further embodiment, the sealing layer is a moisture sealing layer. According to a still yet further embodiment the second dielectric constant is less than about 2.8. According to a yet still further embodiment, the second loss tangent is less than about 0.005.

According to a third embodiment, there is provided a method of providing a semiconductor die, comprising, providing a SC wafer comprising die having a principal surface with conductive interconnections and bonding pads thereon, covering some or all of the principal surface of the die with a buffer layer having a dielectric constant $\epsilon_{bl}$ and/or loss tangent $\delta_{bl}$ less than one or the other, respectively, of those of a material to be used for plastic encapsulating the die, and patterning the buffer layer to substantially expose regions on the bonding pads to be used for coupling the die to external leads but leaving the buffer layer over at least some of the conductive interconnections. According to a still further embodiment, the method further comprises, coupling the exposed regions of the bonding pads to external leads. According to a yet further embodiment, the method further comprises surrounding the die and inner portions of the external leads with a plastic encapsulation having dielectric constant $\epsilon_e$ and loss tangent $\delta_e$, wherein either $\epsilon_e$ is greater than $\epsilon_{bl}$ or $\delta_e$ is greater than $\delta_{bl}$, and wherein the buffer layer separates the at least some of the conductive interconnections from the plastic encapsulation. According to a still yet further embodiment, $\epsilon_e$ is greater than $\epsilon_{bl}$ and $\delta_e$ is greater than $\delta_{bl}$. According to a yet still further embodiment, the method further comprises after the patterning step, forming a sealing layer on an outer surface of the buffer layer. According to an additional embodiment, the method further comprises after the forming step, patterning the sealing layer to substantially expose regions on the bonding pads to be used for coupling the die to external leads but leaving the sealing layer substantially over at least the portion of the buffer layer covering conductive interconnections. According to a yet additional embodiment, the method further comprises prior to the surrounding step, forming a sealing layer on the outer surface of the buffer layer.

While at least one exemplary embodiment has been presented in the foregoing detailed description, it should be appreciated that a vast number of variations exist. For example, a wide variety of lower dielectric constant and lower loss materials may be used for buffer layer 52. Persons of skill in the art will understand that the principals taught herein also apply to such variations. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of providing a semiconductor die, the semiconductor die configured to operate at at least a first predetermined operating frequency, the method comprising:
   providing a die having a principal surface with conductive interconnections and bonding pads thereon;
   covering at least a portion of the principal surface of the die with a buffer layer material to form a buffer layer;
   encapsulating the die with an encapsulant such that the encapsulant substantially surrounds the die and the upper surface of the encapsulant is substantially exposed; and
   patterning the buffer layer to substantially expose regions on the bonding pads to be used for coupling the die to external leads but leaving the buffer layer over at least some of the conductive interconnections;
   wherein the buffer layer material has at least one of the following characteristics: (i) a dielectric constant less than the dielectric constant of the encapsulant, and (ii) a loss tangent less than the loss tangent of the encapsulant at the first predetermined operating frequency.

2. The method of claim 1 wherein the dielectric constant of the buffer layer material is less than approximately 3.0.

3. The method of claim 1 wherein the step of covering comprises coating substantially all of the principal surface of the die with a buffer layer material to form a buffer layer having a substantially uniform thickness.

4. The method of claim 1 wherein the dielectric constant of the buffer layer material is less than the dielectric constant of the encapsulant, and the loss tangent of the buffer layer material is less than the loss tangent of the encapsulant at the first predetermined operating frequency.

5. The method of claim 1 wherein the semiconductor die produces a fringing field when operating at a predetermined frequency, and wherein the step of covering comprises coating at least a portion of the principal surface of the die with a buffer layer material to form a buffer layer having a thickness sufficient to substantially contain the fringing field.

6. A method of providing a semiconductor die comprising:
   providing a die having a principal surface with conductive interconnections and bonding pads thereon;
   covering at least a portion of the principal surface of the die with a buffer layer material to form a buffer layer;
   encapsulating the die with an encapsulant;
   patterning the buffer layer to substantially expose regions on the bonding pads to be used for coupling the die to external leads but leaving the buffer layer over at least some of the conductive interconnections; and
   after the patterning step, forming a sealing layer on an outer surface of the buffer layer;
   wherein the buffer layer material has at least one of the following characteristics: (i) a dielectric constant less than the dielectric constant of the encapsulant, and (ii) a loss tangent less than the loss tangent of the encapsulant.

7. The method of claim 6 wherein the step of forming a sealing layer comprises depositing a sealant onto a surface of the buffer layer, the sealant selected from the group consisting of $SiO_2$, polyimide, and parylene.

8. The method of claim 6 wherein the step of forming a sealing layer comprises exposing the buffer layer to a catalyst to decrease the permeability of the buffer layer to moisture.

* * * * *